(12) United States Patent
Barraud et al.

(10) Patent No.: US 11,239,374 B2
(45) Date of Patent: Feb. 1, 2022

(54) METHOD OF FABRICATING A FIELD EFFECT TRANSISTOR

(71) Applicant: Commissariat A L'Energie Atomique et aux Energies Alternatives, Paris (FR)

(72) Inventors: Sylvain Barraud, Grenoble (FR); Joris Lacord, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 140 days.

(21) Appl. No.: 16/697,558

(22) Filed: Nov. 27, 2019

(65) Prior Publication Data
US 2020/0176613 A1    Jun. 4, 2020

(30) Foreign Application Priority Data
Nov. 29, 2018  (FR) ...................................... 18 72094

(51) Int. Cl.
*H01L 29/786*  (2006.01)
*H01L 29/423*  (2006.01)
(Continued)

(52) U.S. Cl.
CPC .. *H01L 29/78696* (2013.01); *H01L 29/42392* (2013.01); *H01L 29/66484* (2013.01);
(Continued)

(58) Field of Classification Search
CPC ......... H01L 29/78696; H01L 29/66484; H01L 29/78568; H01L 29/42376;
(Continued)

(56) References Cited

U.S. PATENT DOCUMENTS

| 5,804,848 | A | * | 9/1998 | Mukai | ............... | H01L 29/42392 |
| | | | | | | 257/270 |
| 6,396,108 | B1 | * | 5/2002 | Krivokapic | ....... | H01L 29/66795 |
| | | | | | | 257/365 |

(Continued)

OTHER PUBLICATIONS

U.S. Appl. No. 15/724,862, filed Oct. 4, 2017, 2018/0097095 A1, Barraud, S.

(Continued)

*Primary Examiner* — Victoria K. Hall
(74) *Attorney, Agent, or Firm* — Oblon, McClelland, Maier & Neustadt, L.L.P.

(57) ABSTRACT

A method for producing an FET transistor includes producing a transistor channel, comprising at least one semiconductor nanowire arranged on a substrate and comprising first and second opposite side faces; producing at least two dummy gates, each arranged against one of the first and second side faces of the channel; etching a first of the two dummy gates, forming a first gate location against the first side face of the channel; producing a first gate in the first gate location and against the first side face of the channel; etching a second of the two dummy gates, forming a second gate location against the second side face of the channel; and producing a second gate in the second gate location and against the second side face of the channel.

15 Claims, 13 Drawing Sheets

(51) Int. Cl.
*H01L 29/66* (2006.01)
*H01L 29/78* (2006.01)

(52) U.S. Cl.
CPC .. *H01L 29/66545* (2013.01); *H01L 29/66742* (2013.01); *H01L 29/7855* (2013.01); *H01L 29/7856* (2013.01); *H01L 29/78648* (2013.01)

(58) Field of Classification Search
CPC ........... H01L 29/66545; H01L 29/7855; H01L 29/7856; H01L 29/78648
See application file for complete search history.

(56) References Cited

U.S. PATENT DOCUMENTS

| | | | | |
|---|---|---|---|---|
| 6,424,001 | B1 * | 7/2002 | Forbes | H01L 27/11556 257/315 |
| 6,433,609 | B1 * | 8/2002 | Voldman | H03K 5/08 327/313 |
| 6,472,258 | B1 * | 10/2002 | Adkisson | H01L 29/42384 257/329 |
| 6,689,650 | B2 * | 2/2004 | Gambino | H01L 29/42384 257/302 |
| 6,762,448 | B1 * | 7/2004 | Lin | H01L 29/66795 257/302 |
| 6,787,402 | B1 * | 9/2004 | Yu | H01L 29/66795 438/142 |
| 6,831,310 | B1 * | 12/2004 | Mathew | H01L 27/108 257/270 |
| 6,903,967 | B2 * | 6/2005 | Mathew | B82Y 10/00 365/177 |
| 6,911,697 | B1 * | 6/2005 | Wang | H01L 29/7856 257/347 |
| 7,129,550 | B2 * | 10/2006 | Fujiwara | H01L 29/41733 257/401 |
| 7,192,876 | B2 * | 3/2007 | Mathew | H01L 29/7923 438/720 |
| 7,301,741 | B2 * | 11/2007 | Khazhinsky | H01L 27/0292 361/56 |
| 7,329,913 | B2 * | 2/2008 | Brask | H01L 21/823821 257/287 |
| 7,432,122 | B2 * | 10/2008 | Mathew | H01L 29/7391 438/48 |
| 7,544,980 | B2 * | 6/2009 | Chindalore | H01L 29/7881 257/288 |
| 7,566,623 | B2 * | 7/2009 | Mathew | H01L 29/66795 257/365 |
| 7,629,640 | B2 * | 12/2009 | She | G11C 16/0475 257/324 |
| 8,203,182 | B2 * | 6/2012 | Muller | H01L 29/7855 257/347 |
| 8,288,823 | B2 * | 10/2012 | Ernst | H01L 29/66795 257/365 |
| 8,501,563 | B2 * | 8/2013 | Sandhu | H01L 29/66825 438/257 |
| 9,018,713 | B2 * | 4/2015 | Erickson | H01L 21/823431 257/401 |
| 9,484,267 | B1 | 11/2016 | Cheng et al. | |
| 10,516,047 | B2 * | 12/2019 | Sio | B82Y 10/00 |
| 10,522,669 | B2 * | 12/2019 | Barraud | H01L 29/66227 |
| 2004/0235300 | A1 * | 11/2004 | Mathew | H01L 29/792 438/689 |
| 2005/0051825 | A1 * | 3/2005 | Fujiwara | H01L 29/66545 257/308 |
| 2005/0124120 | A1 * | 6/2005 | Du | H01L 21/823437 438/283 |
| 2005/0242391 | A1 * | 11/2005 | She | G11C 16/0475 257/324 |
| 2007/0148857 | A1 * | 6/2007 | Ban | H01L 27/1203 438/243 |
| 2009/0085119 | A1 * | 4/2009 | Ernst | H01L 29/66439 257/365 |
| 2009/0209092 | A1 * | 8/2009 | Sonsky | H01L 29/6681 438/479 |
| 2010/0102389 | A1 * | 4/2010 | Muller | H01L 29/6681 257/347 |
| 2011/0147837 | A1 * | 6/2011 | Hafez | H01L 29/66659 257/338 |
| 2014/0110765 | A1 * | 4/2014 | Murali | H01L 29/4966 257/288 |
| 2015/0090958 | A1 * | 4/2015 | Yang | H01L 29/0676 257/27 |
| 2015/0194489 | A1 * | 7/2015 | Barraud | H01L 29/0649 257/9 |
| 2015/0340438 | A1 * | 11/2015 | Zhu | H01L 21/7688 257/77 |
| 2016/0300155 | A1 | 10/2016 | Betz et al. | |
| 2016/0365440 | A1 * | 12/2016 | Suk | H01L 29/42392 |
| 2018/0097095 | A1 * | 4/2018 | Barraud | H01L 29/0895 |
| 2018/0151729 | A1 * | 5/2018 | Sio | H01L 29/42316 |
| 2018/0315817 | A1 * | 11/2018 | Van Dal | H01L 21/823821 |
| 2018/0323312 | A1 * | 11/2018 | Van Dal | H01L 29/66772 |
| 2019/0148367 | A1 * | 5/2019 | Colinge | H01L 27/0924 257/499 |
| 2019/0280113 | A1 * | 9/2019 | Hook | H01L 27/0886 |
| 2020/0203341 | A1 * | 6/2020 | Barraud | H01L 21/823885 |
| 2020/0227533 | A1 * | 7/2020 | Ma | H01L 29/42376 |

OTHER PUBLICATIONS

U.S. Appl. No. 16/184,346, filed Nov. 8, 2018, 2019/0148367 A1, Colinge, J, et al.
French Preliminary Search Report dated Oct. 28, 2019 in French Application 18 72094 filed on Nov. 29, 2018 (with English Translation of Categories of Cited Documents), citing documents AA-AE & documents AX-AY therein, 3 pages.
Dupre, C, et al., "15 nm-diameter 3D Stacked Nanowires with Independent Gates Operation: ΦFET", IEEE Electron Devices Meeting, 2008, pp. 1-4.
Munteanu, D, et al., "Simulation Analysisof Bipolar Amplification in Independent-Gate FinFET and Multi-Channel NWFET Submitted to Heavy-Ion Irradiation", IEEE Transactions on Nuclear Science, vol. 59, No. 6, 2012, pp. 3249-3257.

* cited by examiner

METHOD OF FABRICATING A FIELD EFFECT TRANSISTOR

TECHNICAL FIELD AND PRIOR ART

The invention concerns the field of FET transistors used for high-performance, low-power logic applications of microelectronics, having improved electrical performance with respect to the current state-of-the-art and for which the threshold voltages are easily adjustable.

The Fin Field-Effect Transistor (FinFET) is currently the FET transistor architecture which responds to the most advanced specifications of CMOS technology nodes. The FinFET transistor comprises a channel produced in the form of one or more portions of silicon in the form of raised "fingers" or "fins". This particular geometry, when compared with a conventional MOSFET transistor, makes it possible to increase the level of current per unit area obtained in the transistor, while maintaining good electrostatic control of the channel and therefore low leak level in the OFF or blocked state of the transistor. A FinFET can be manufactured on a bulk substrate or on an SOI substrate. The good electrostatic control of the channel obtained by this type of transistor allows the production of gates having smaller lengths than for MOSFET transistors having a planar architecture, while maintaining electrical performances that are identical to, or even better than, those of planar MOSFET transistors. Thus, a FinFET transistor can be produced with a gate length that can be approximately 15 to 20 nm.

The threshold voltage of a FinFET transistor is adjusted by the choice of the gate metal, depending on its work function. By contrast, an adjustment to the threshold voltage of the FinFET transistor via an adjustment of the geometric dimensions (length and height) of the fingers of the FinFET transistor is critical and may be incompatible with the constraints linked to the conservation of good electrostatic control, which is manifest by a low Drain-Induced Barrier Lowering (DIBL) and a low gradient under the threshold. Thus, the production, on a same substrate or a same chip, of a plurality of FinFET transistors operating with different threshold voltages therefore implies producing various gate stacks (dielectric+metal) locally on the chip or the substrate, with different materials according to the intended applications of the various circuits embedded on the chip or the substrate.

In addition, for short gate lengths, for example less than approximately 15 nm, the electrostatic control obtained with a FinFET transistor becomes insufficient. For such gate lengths, it is possible to use a Gate-All-Around Field-Effect Transistor (GAAFET). In such a transistor, the gate encloses or surrounds one or more silicon nanowires which form the channel of the transistor, which increases the contact area between the gate and the channel of the transistor and makes it possible to obtain excellent electrostatic control and an increase in the drain current per unit area while retaining a lower leak current in the OFF state than for a FinFET transistor having a same gate length. As with FinFET transistors, it is however not possible to produce, on a same substrate, a plurality of transistors operating with different threshold voltages, without having to produce different gate stacks (dielectric+metal) locally using different materials. As with the FinFET, the only means of obtaining, on a same substrate, a plurality of transistors having different threshold voltages from each other is to produce different gate stacks for the transistors which are intended not to have the same threshold voltage.

Document US 2015/194489 A1 describes another type of transistor comprising a plurality of silicon nanowires between which portions of high-permittivity dielectric material are arranged. This transistor therefore has a FinFET-type structure, with a gate present on three sides of the stack formed by the nanowires and the dielectric portions, facilitating the etching of the gate, but in which, in comparison to a conventional FinFET transistor, a larger drain current and a reduced leak current are obtained via an improved electrostatic control. This transistor therefore makes it possible to retain the simplicity of manufacture of a FinFET transistor, with a standard etching of the gate, while retaining the advantages (in terms of transport properties) of a GAAFET transistor. However, as with FinFET and GAAFET transistors, the only way to provide a solution with multiple threshold voltages is to produce different gate stacks depending on the threshold voltage desired for the transistors.

A Fully-Depleted Silicon-On-Insulator (FDSOI) transistor has a structure which, due to biasing from a rear face of the transistor, enables modulating of its threshold voltage. By contrast, the FDSOI transistor does not provide the performance of a FinFET or GAAFEET transistor for short gate lengths, for example less than 15 nm.

DISCLOSURE OF THE INVENTION

There is therefore a need to provide a method for producing an FET transistor combining the advantages of the structures of FDSOI and GAAFET, or FDSOI and FinFET transistors, in other words for which the threshold voltage can be modulated while having comparable performance to that of a FinFET or GAAFET transistor, even for short gate lengths, for example less than approximately 15 nm.

For this, a method is proposed for producing an FET transistor, comprising at least the implementation of the following successive steps:
- producing an FET transistor channel comprising at least one semiconductor nanowire arranged on a substrate and comprising first and second opposite side faces substantially perpendicular to a face of the substrate on which the channel is arranged and substantially parallel to a direction of flow of a conduction current intended to pass through the channel when the FET transistor is in an ON state;
- producing at least two dummy gates, each arranged against one of the first and second side faces of the channel;
- etching a first of the two dummy gates, or temporary gates, forming at least one first gate location against the first side face of the channel;
- producing at least one first gate in the first gate location and at least against the first side face of the channel;
- etching a second of the two dummy gates, forming at least one second gate location against the second side face of the channel;
- producing at least one second gate in the second gate location and at least against the second side face of the channel.

With this production method, it is possible to produce an FET transistor, the channel of which comprises at least one semiconductor nanowire, with an at least partially surrounded gate, making it possible to maintain a high level of conduction current passing through the channel. In addition, this method proposes producing two distinct gates around the transistor channel, one (for example the first) can serve as front gate, in other words triggering or blocking the passage of the current through the transistor channel, and the other (for example the second) can have a similar role to that of the back gate of an FDSOI transistor, in other words modulating the electrostatic current of the channel and therefore the threshold voltage of the transistor, the properties of these two gates (materials, thicknesses) being independent from one gate to the other. The threshold voltage of the transistor can therefore be modulated, not only by choosing the materials and the thicknesses of these materials forming the gate dielectric and the gate conductive material of this second gate independently of those of the first gate, but also through the possibility of modulating the value of an electrical potential applied on the second gate.

For example, independently of the thickness of the dielectric of the first gate, the thickness of the dielectric of the second gate (which enables the threshold voltage of the transistor to be modulated) can be chosen to be sufficiently fine in order to promote good control of the second gate over a part of the side flanks of the channel. The gate dielectric of the second gate has a thickness which can be easily adjusted and which can, in particular, be very fine, unlike the thickness of the buried dielectric of an FDSOI transistor which is difficult to be less than 20 nm without generating a high variability.

This independence of the properties of the first and second gates with respect to each other is obtained, in particular, through the sequential implementation of the steps for producing these gates, the first gate being produced before the second gate.

Regarding the nature of the gate conductive materials of the first and second gates, a different work function can be obtained between the first and second gates in order to adjust a desired threshold voltage. A dissymmetry can be created by the two gates between the two side flanks of the channel. This dissymmetry can be generated by a change of thickness between the gate dielectrics of the first and second gates.

The method may be implemented in order to produce n-type and/or p-type FET transistors.

Advantageously, each of the two gates may be biased independently from each other. In a variant, it is possible that the two gates are connected together.

This method may be implemented in order to create a platform with multiple threshold voltages, comprising a plurality of groups of FET transistors having different threshold voltages.

The direction of flow of the conduction current intended to pass through the channel when the FET transistor is in an ON state corresponds to the direction of flow of the current flowing in the channel between the drain and the source or from the source to the drain depending on the conductivity of the transistor (n or p).

According to an advantageous embodiment, the method may also be such that:
the channel comprises a plurality of nanowires, stacked one above the other;
each nanowire comprises first and second side faces forming the first and second side faces of the channel.

This advantageous embodiment enables, in particular, the production of a GAAFET transistor in which, through the increase in the number of stacked nanowires, the level of current per unit area that can be attained in the channel is larger.

The production of the channel may comprise implementing the steps of:
producing, on the substrate, an alternating stack of first semiconductor layers and at least one second layer of material configured to be selectively etched with respect to the semiconductor of the first layers;
producing an etching mask on the stack, the pattern of which, in a plane parallel to the substrate, corresponds to that of the channel;
etching the stack according to the etching mask pattern, such that the remaining portions of the first semiconductor layers form nanowires.

The plane parallel to the substrate corresponds to a plane parallel to the main faces of the substrate, in other words the two faces of the substrate having the largest dimensions and which generally form the upper and lower faces of the substrate. The channel of the transistor is produced on one of these main faces of the substrate, namely the upper face.

The production of two dummy gates may comprise implementing the steps of:
depositing at least one sacrificial material covering the substrate and the channel;
planarisation of the sacrificial material with stop on the etching mask;
etching the sacrificial material such that at least two remaining portions of the sacrificial material form the two dummy gates.

The method may further comprise, after etching of the stack, implementing an etching step of at least one remaining portion of the second layer arranged between the nanowires.

In this case, the method may further comprise, between the etching of said at least one remaining portion of the second layer arranged between the nanowires and the production of two dummy gates, the implementation of a step of producing at least one portion of dielectric material between the nanowires. This portion of dielectric material, produced between the nanowires after the etching of the remaining portion of the second layer arranged between the nanowires, serves, in particular, to prevent the deposition of the sacrificial material, used for the production of the dummy gates, between the nanowires.

The production of the first gate may comprise implementing the following steps:
depositing a first high-permittivity gate dielectric in the first gate location and at least against the first side face of the channel;
depositing a first gate conductive material in the first gate location and against the first gate dielectric;

and the production of the second gate may comprise implementing the following steps:
depositing a second gate dielectric in the second gate location and at least against the second side face of the channel;
depositing a second gate conductive material in the second gate location and against the second gate dielectric.

The first gate dielectric may have a high permittivity and therefore correspond to a so-named "High-K" dielectric, in other words one for which the dielectric permittivity has a value greater than that of the dielectric permittivity of $SiO_2$ which is equal to approximately 3.9.

The portion of dielectric material may comprise at least one dielectric material having a relative permittivity greater than 3.9, and the portion of dielectric material may be preserved during the implementation of the steps of producing the first and second gates.

The method may further comprise, between the production of said at least one portion of dielectric material between the nanowires and the depositing of the first gate dielectric, the implementation of an etching step of said at least one portion of dielectric material between the nanowires, and wherein the first gate dielectric is also deposited between the nanowires, against the walls of the nanowires which are substantially perpendicular to the side faces of the channel.

The method may further comprise, before producing the second gate, a step of determining the nature of the material or materials intended to form the second gate dielectric and the thickness of the second gate dielectric, depending on the value of at least one threshold voltage of the FET transistor.

The method may be such that:
the channel comprises a first and a second stack of nanowires arranged one beside the other on the substrate, the nanowires of each of the first and second stacks being stacked one above the other;
the nanowires of each of the first and second stacks each comprise first and second side faces forming the first and second side faces of the channel;
the second gate is arranged between the first and second stacks of nanowires and against the second side faces of the nanowires of the first and second stacks;
the first gate comprises at least two distinct parts, one of two parts of the first gate being arranged against the first side faces of the nanowires of the first stack, and the other of the two parts of the first gate being arranged against the first side faces of the nanowires of the second stack.

In this case, the first gate may be produced by forming an interdigitated structure.

According to another embodiment, the method may be such that:
the channel comprises a plurality of first and second stacks of nanowires arranged one beside the other on the substrate, the nanowires of each of the first and second stacks being stacked one above the other;
the nanowires of each of the first and second stacks each comprise first and second side faces;
the second gate comprises a plurality of distinct parts, each arranged between one of the first stacks of nanowires and one of the second stacks of nanowires and against the second side faces of the nanowires of said one of the first stacks and one of the second stacks;
the first gate comprises a plurality of distinct parts, each arranged against the first side faces of the nanowires of one of the first and second stacks or against the first side faces of the nanowires of one of the first stacks and one of the second stacks.

Here again, the first gate may be produced in the form of an interdigitated structure.

The substrate may comprise a dielectric layer and an electrically conductive layer such that the dielectric layer is arranged between the channel and the electrically conductive layer, and one of the first and second gates may be electrically connected to the electrically conductive layer. This electrically conductive layer, formed for example by doping under a buried dielectric layer of a semiconductor-on-insulator substrate, may thus allow the electrical contacting of one of the two gates from the rear face, the other gate being able to be electrically connected to an electrical contact directly from the front face of the transistor.

The substrate may be of the semiconductor-on-insulator type, for example SOI.

Also proposed is an FET transistor comprising at least:
a substrate;
a channel formed of a stack of at least two nanowires arranged on the substrate, each nanowire comprising first and second opposite side faces substantially perpendicular to a face of the substrate on which the channel is arranged and substantially parallel to a direction of flow of a conduction current intended to pass through the channel when the FET transistor is in an ON state, and each nanowire comprising opposite lower and upper faces substantially parallel to said face of the substrate;
a first gate arranged against the first side faces of the nanowires and comprising at least one extension region extending between the nanowires in such a way as to form an interdigitated gate and covering the upper face of a first of the nanowires and a lower face of a second of the nanowires;
a second gate,
wherein the second gate covers, among all the faces of the nanowires, only the second side face of at least one of the nanowires.

Each of the first and second gates may comprise at least one gate dielectric distinct from that of the other gate, and at least one gate conductive material distinct from that of the other gate, and, in the extension region of the first gate, the gate conductive materials of the first and second gates may be insulated from each other, at least by the gate dielectrics of the first and second gates.

BRIEF DESCRIPTION OF THE FIGURES

The present invention will be better understood on reading the description of the embodiments, given purely by way of indication and in no way limiting, by making reference to the attached drawings, in which.

Identical, similar or equivalent parts of the various figures described below are given the same reference numbers in order to facilitate the passage from one figure to another.

The various parts shown in the figures are not necessarily on a uniform scale, in order to make the figures more readable.

The various possibilities (variants and embodiments) should be understood as not being exclusive from each other and can be combined together.

DETAILED DISCLOSURE OF THE SPECIAL EMBODIMENTS

First, consider FIGS. 1 to 13 which show the steps of a method for producing an FET transistor 100 with threshold voltage that can be modulated, according to a first embodiment.

Figure 1:
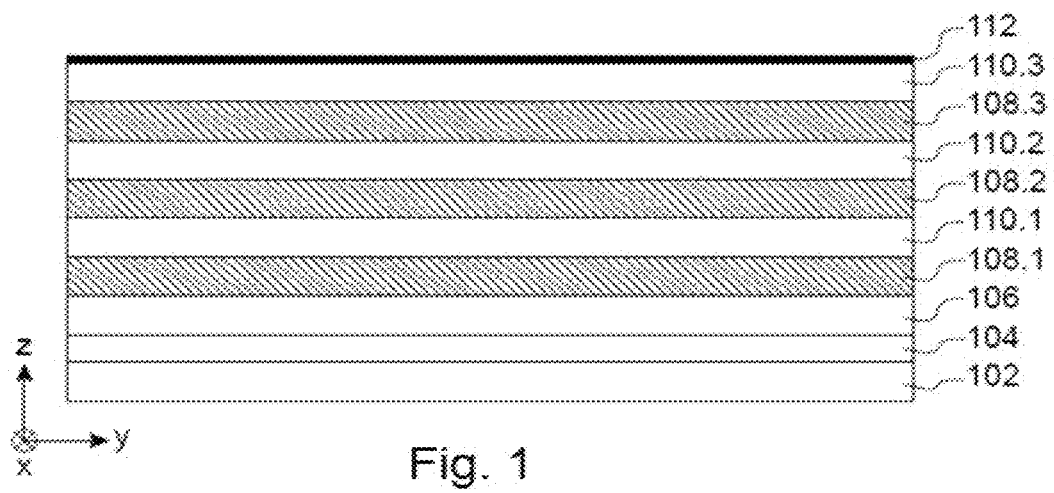
FIGS. 1 to 13 show the steps of a method for producing an FET transistor with threshold voltage that can be modulated, according to a first embodiment.
Figure 2:
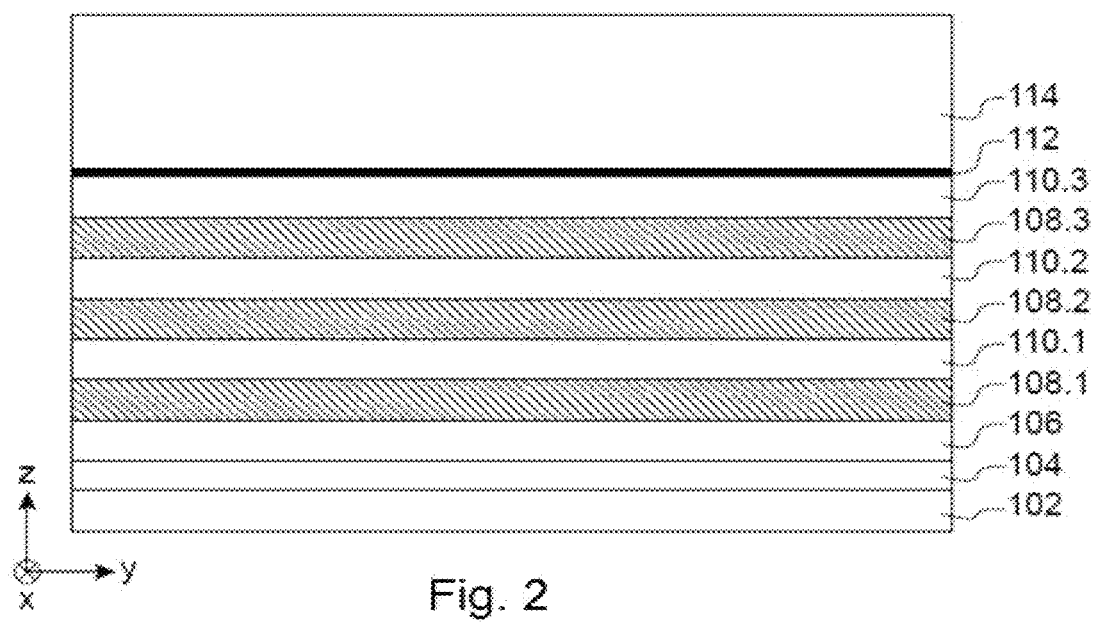

As shown in FIG. 1, the transistor 100 is produced from a semiconductor-on-insulator substrate, in this case SOI. The SOI substrate comprises a semiconductor support layer 102 on which is deposited a buried dielectric layer 104, or Buried OXide (BOX), and a surface semiconductor layer 106.

The support layer 102 comprises, for example, silicon and its thickness is, for example, equal to several hundred microns.

The buried dielectric layer 104 comprises, for example, a semiconductor oxide, advantageously $SiO_2$. The thickness of the buried dielectric layer 104 is, for example, between approximately 25 nm and 145 nm.

The semiconductor of the surface layer 106 corresponds to that desired in order to produce a or one of the nanowires intended to form the channel of the transistor 100. In the first embodiment described here, this semiconductor is silicon. In a variant, this semiconductor may be SiGe with, in that case, a layer of silicon which is formed subsequently on the surface layer 106 and which serves to produce the nanowire or one of the nanowires of the transistor 100. The thickness of the layer 106 is, for example, between approximately 4 nm and 25 nm.

In the first embodiment, the transistor 100 comprises a channel intended to be formed of a plurality of semiconductor nanowires stacked one on top of the other. An alternated stack of layers of the semiconductor of these nanowires (including the surface layer 106) and another material configured to be selectively etched with respect to this semiconductor is formed on the buried dielectric layer 104. In the first embodiment described here, the semiconductor of the nanowires is silicon, and the material configured to be selectively etched with respect to the silicon is SiGe. In FIG. 1, this stack comprises the surface layer 106 and silicon layers 110 (three layers 110.1-110.3 in this example) intended to form the nanowires of the channel of the transistor 100, and SiGe layers 108 (three layers 108.1-108.3 in this example) which serve to form the spacings between the nanowires of the channel of the transistor 100. In the example of FIG. 1, the layer 108.1 is arranged between the surface layer 106 and the layer 110.1, and each of the layers 108.2 and 108.3 is arranged between two of the layers 110.1-110.3. The stack of layers 106, 108 and 110 forms a Si/SiGe super-network.

The number of layers forming this alternated stack of layers 106, 108 and 110 is chosen according to the number of stacked nanowires intended to form the channel of the transistor 100. In the first embodiment described here, the channel of the transistor 100 is intended to be formed of four stacked nanowires, and the stack produced therefore comprises the layer 106 and three layers 110.1-110.3 each intended to form one of the nanowires.

In general, the transistor 100 comprises a number of stacked nanowires between approximately 2 and 8.

The concentration of germanium in the SiGe of layers 108 is such that a good etching selectivity is obtained with respect to the silicon layers 106 and 110 and is, for example, between approximately 20% and 45% and is, for example, equal to 20%, 30% or 45%. The higher the concentration of germanium in the SiGe of layers 108, the higher the etching selectivity of this SiGe with respect to the silicon of layers 106 and 110.

The layers 108 and 110 are produced, for example, by epitaxy from the surface layer 106. The thickness of each of the layers 108, 110 of the stack is, for example, between approximately 5 nm and 20 nm and is, for example, equal to approximately 10 nm. In the embodiment described here, the total thickness of the stack formed by the layers 106, 108 and 110 is, for example, equal to approximately 84 nm.

A first etch stop layer 112 is then deposited on the stack of layers 106, 108 and 110. This layer 112 comprises, for example, $HfO_2$ or $SiO_2$, formed, for example, by deposition such as a Physical Vapour Deposition (PVD), Chemical Vapour Deposition (CVD) or Atomic Layer Deposition (ALD), at a temperature equal to approximately 300° C. and has, for example, a thickness equal to approximately 4 nm.

A hard mask, intended to form a separation between the two gates of the transistor 100, is then produced on this stack. A layer 114 of material suitable for forming such a hard mask, for example a semiconductor nitride such as SiN, is first deposited on the stack (see FIG. 2). The thickness of the layer 114 is, for example, equal to approximately 55 nm, or more generally between approximately 40 nm and 100 nm. The deposition implemented in order to form this layer 114 is, for example, a low-pressure chemical vapour deposition (LPCVD) and is implemented at a temperature, for example, equal to approximately 778° C.

Figure 3:
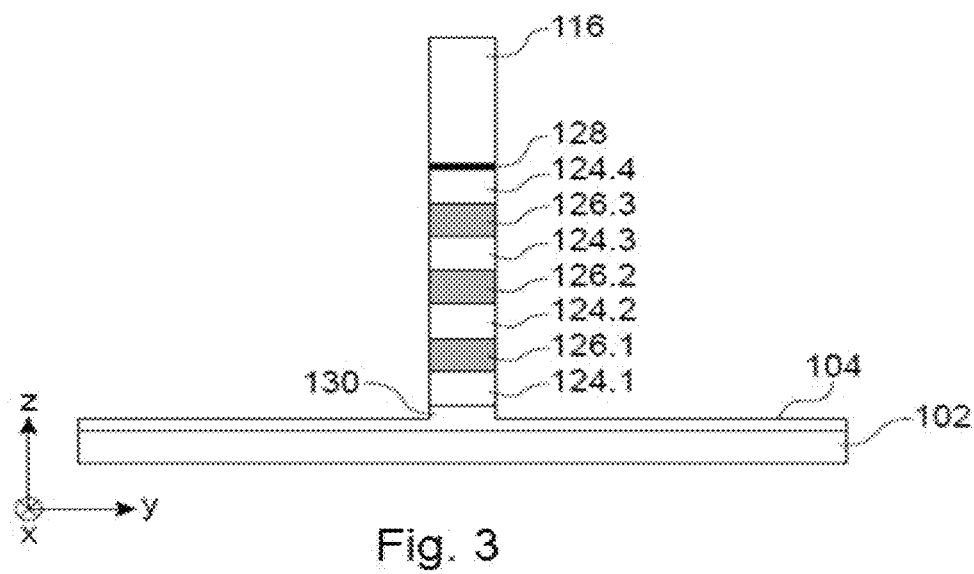
Figure 4:
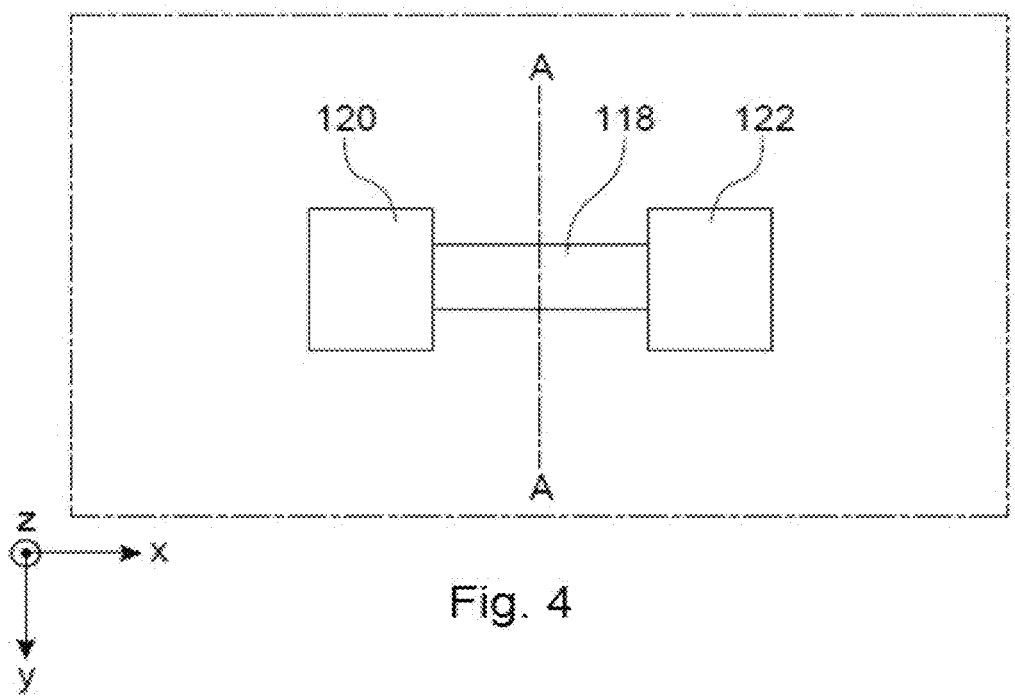

As shown in FIGS. 3 and 4 (FIG. 3 is a sectional view along an axis AA visible in FIG. 4, FIG. 4 is a top-view of the structure produced), steps of lithography and etching through the layers 114, 112, 110, 108, 106 and a part of the thickness of layer 104 are implemented, according to a pattern (in the plane (X,Y) parallel to the main plane of the substrate) corresponding to that of the nanowires and optionally of at least one part of the source and drain regions of the transistor 100. The remaining portion of the layer 114 forms a hard mask 116. As can be seen in FIG. 4, the pattern engraved in the stack of layers 114, 112, 110, 108, 106 and 104, in the plane (X, Y), comprises a central part 118 in which the nanowires of the channel of the transistor 100 are formed. The ends of the central part 118 are connected to two parts 120, 122 of larger dimensions (along the axis Y, which belongs to the main plane of the substrate and which is substantially perpendicular to the future direction of current flow in the nanowires) and intended to produce the source and drain of the transistor 100. In a variant, it is possible that the parts 120, 122 do not have dimensions which are larger along the axis Y than those of the central part 118.

The remaining portions of the layers 106 and 110 form, in particular, stacked nanowires 124 (four nanowires 124.1-124.4 in this example) spaced apart by portions 126 (three portions 126.1-126.3 in this example) corresponding to the remaining portions of the layers 108. The remaining portion of the layer 112 has reference sign 128 in FIG. 3. This etching is continued through a part of the thickness of the buried dielectric layer 104 such that a part 130 of the layer 104 has, over the part of the etched thickness of the layer 104, a similar pattern to that of the mask 116 and the remaining portions of the other layers 112, 110, 108, 106.

The width of the central part 118 (dimension along the axis Y), defining the critical dimension of the transistor 100 and which corresponds to the width of the nanowires 124, is equal here to approximately 20 nm and can, for example, be between approximately 10 nm and 50 nm. The length of the central part 118 (dimension along the axis X), defining the length of the nanowires 124 is, for example, between approximately 10 nm and 500 nm.

Figure 5:
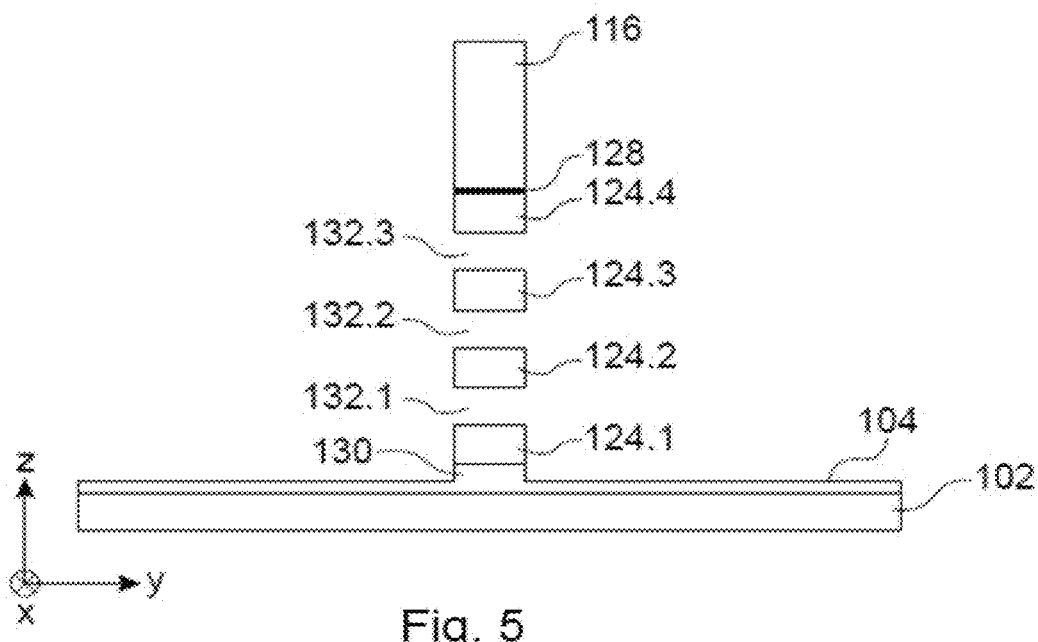

As illustrated in FIG. 5, the portions 126 of SiGe located in the central part 118, between the nanowires 124, are selectively etched with respect to the semiconductor of the nanowires 124, thus releasing these nanowires 124 from one another. This selective etching is advantageously a chemical etching implemented, for example, using acetic acid. The nanowires 124 are held at their ends by semiconductor pads formed by the parts of the stack of layers 106, 108 and 110 located in the parts 120, 122 and wherein the SiGe of layers 108 is not etched. This etching of the material of the portions 126 forms empty spaces 132 (three empty spaces 132.1-132.3 in this example) between the nanowires 124.

Figure 6:
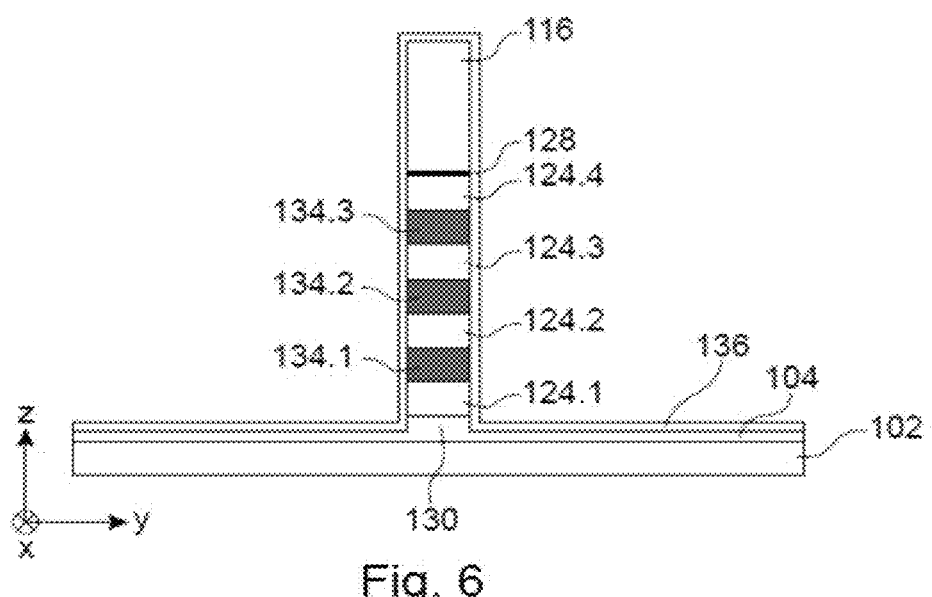
Figure 7:
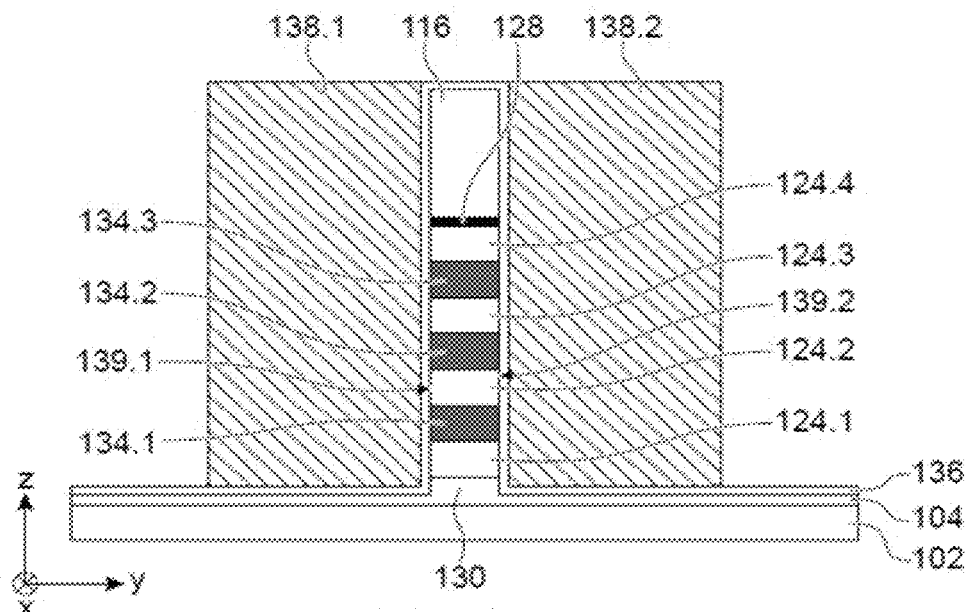

A dielectric material is then deposited in a conformal manner over the entire structure produced, and is then etched (for example by a wet etching) in order to preserve only the portions 134 (three portions 134.1-134.3 in this example) of the dielectric material which fill the empty spaces 132 between the nanowires 124 (see FIG. 6). The dielectric material of the portions 134 is, for example, a semiconductor oxide or nitride, such as for example $SiO_2$ or SiN.

A second etch stop layer 136 comprising, for example, tetraethyl orthosilicate (TEOS) and for which the thickness is, for example, between 2 and 10 nm, is deposited over the entire structure produced, thus covering the layer 104, the side flanks of the nanowires 124, the dielectric portions 134, the portion 128 and the hard mask 116, as well as the upper face of the hard mask 116.

The dummy gates 138, or temporary gates, are then produced on two sides of the stack of nanowires 124 and the portions 134, in other words against the first and second side faces 139.1, 139.2 of the channel of the transistor 100 (with the layer 138 interposed between these dummy gates 138 and the stack of nanowires 124 and portions 134). These first and second side faces 139.1, 139.2 (which are parallel to the plane (X, Z) in FIG. 7) are opposite and substantially perpendicular to a face of the substrate on which the channel is deposited (face parallel to the plane (X, Y) in FIG. 7) and substantially parallel to a direction of flow of the conduction current intended to pass through the channel when the transistor 100 is ON (direction parallel to the axis X in FIG. 7).

For the production of the dummy gates 138, a layer of material intended to form these dummy gates 138 is first deposited on the entire structure produced at this stage of the process, covering the second etch stop layer 136, including over the stack 116+124+128+134. This layer has a thickness greater than the sum of the thicknesses of the stack formed of the nanowires 124, the portions 134, the portion 128, the hard mask 116 and the layer 136. In the embodiment described here, this layer has a thickness equal to approximately 380 nm and, more generally, between approximately 100 nm and 500 nm. In addition, the material of this layer is, for example, polycrystalline silicon or any other material able to be selectively etched with respect to the dielectric material which will subsequently be used to form an insulator around the transistor 100.

This layer intended to form the dummy gates 138 is then planarised, for example by implementing a Chemical Mechanical Planarisation (CMP), with stop on the second etch stop layer 136 (more precisely on the part of this layer 136 located at the top of the stack 116+124+128+134). The production of dummy layers 138 is achieved by performing a lithography and an etching, with stop on the second etch stop layer 136, according to the pattern desired for these dummy gates 138. At the end of these steps, two dummy gates 138.1, 138.2 are obtained deposited on either side of the stack of nanowires 124 and the portions 134 and the hard mask 116, and each against one of the side faces 139.1, 139.2 of the channel (see FIG. 7). These two dummy gates 138.1, 138.2 are separated from each other by the stack of nanowires 124 and the portions 134, as well as the hard mask 116 and the layer 136.

Figure 8:
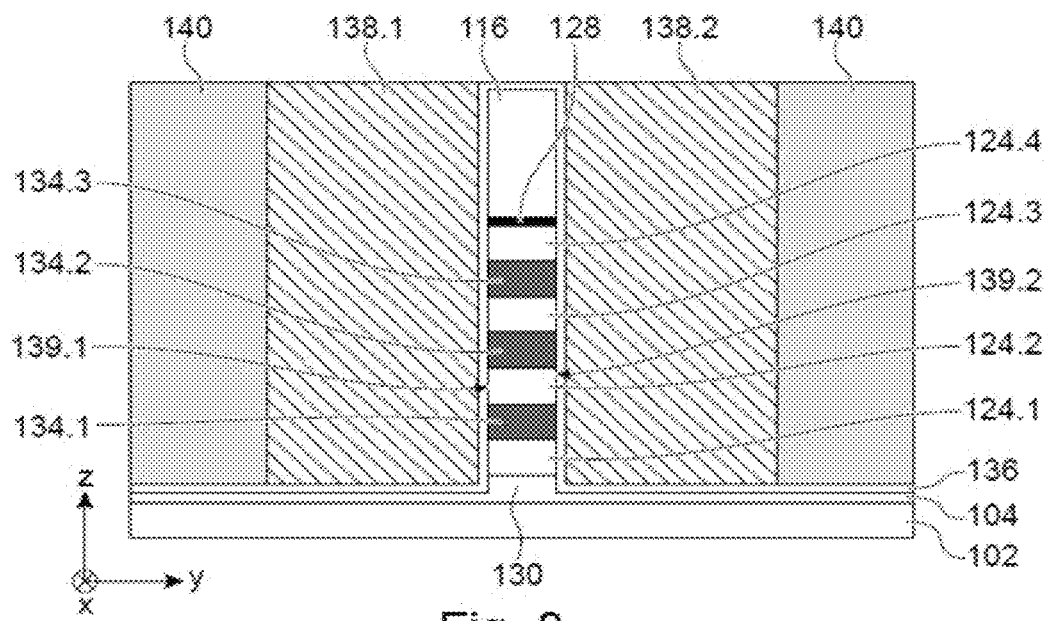

As illustrated in FIG. 8, an insulating dielectric 140, also named the Primary Metal Dielectric (PMD) is formed around the previously produced elements of the transistor. This insulating dielectric 140 is, for example, $SiO_2$. This insulating dielectric 140 is produced, for example, by a deposit in the form of a thick layer (thickness greater than that of the dummy gates 138) then a planarisation with stop on the layer 136.

Figure 9:
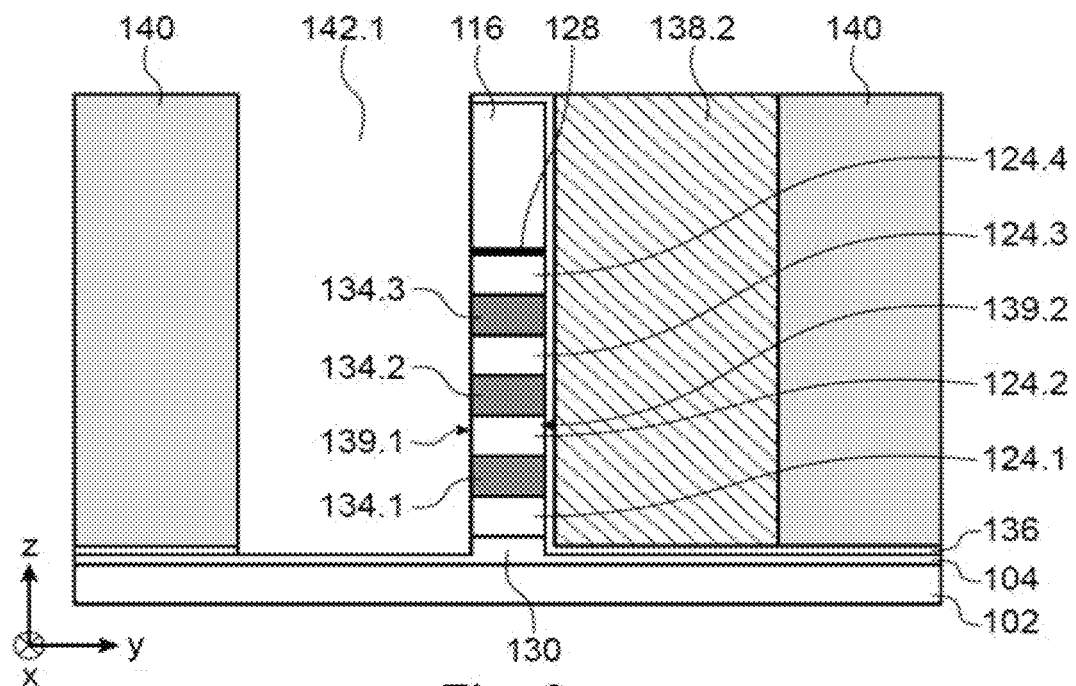

A first of the two dummy gates 138.1, 138.2 is then etched (the first dummy gate 138.1 in FIG. 9). This etching is selective with respect to the materials of the nanowires 124, the portions 134, the hard mask 116 and the insulating dielectric 140, and corresponds, in the embodiment described here, to a chemical etching implemented, for example, using a solution of tetramethylammonium hydroxide (TMAH). In order that the second dummy gate 138.2 is not etched during this etching step, a mask is, for example, produced above this second dummy gate 138.2 in order to protect it. The portions of the layer 136 located against the side flanks of the stack 116+124+128+134 and against the layer 104 are also etched. As illustrated in FIG. 9, at the end of this etching, an empty space is present at the location previously occupied by the first dummy gate 138.1, this empty space forming a first gate location 142.1 which will then make it possible to form a first gate against the first side face 139.1 of the channel of the transistor 100.

Figure 10:
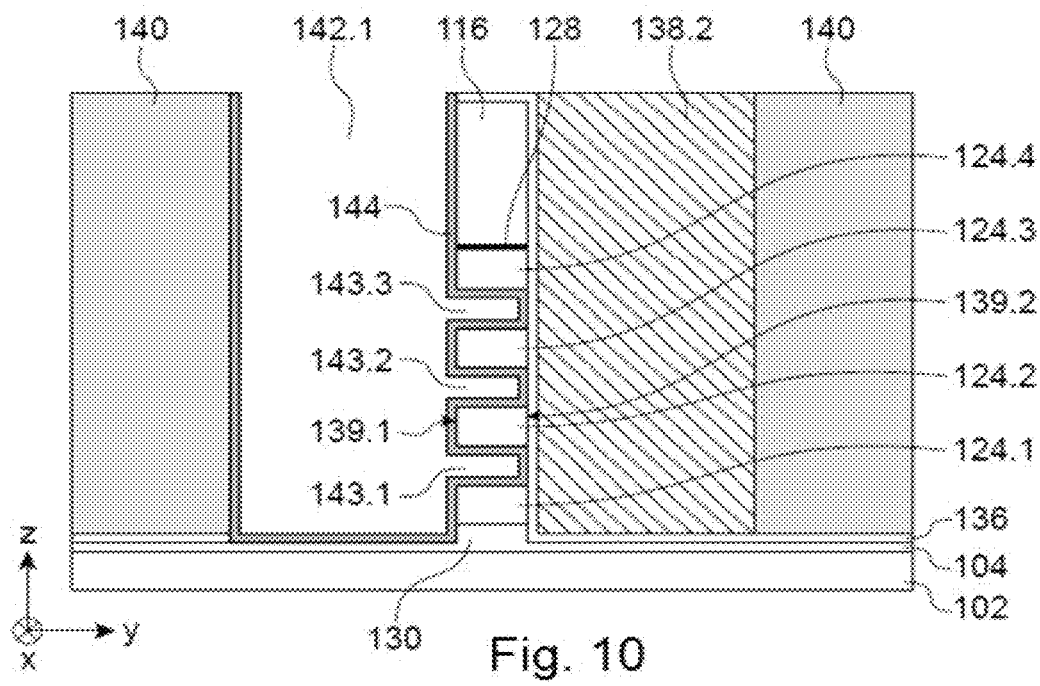
Figure 11:
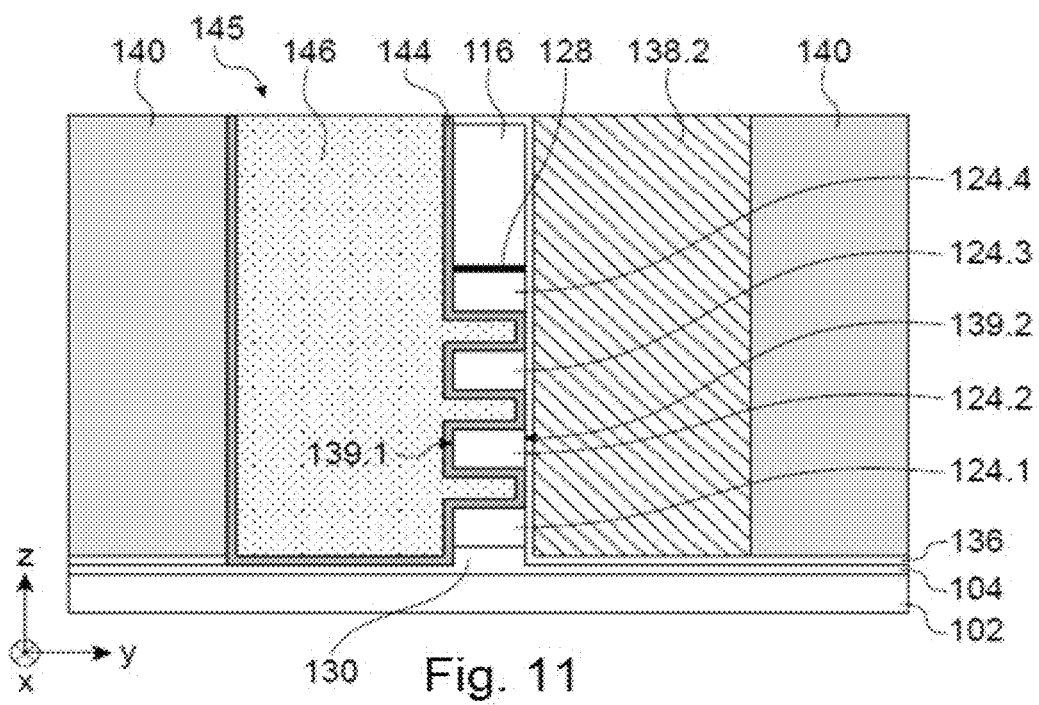

The portions 134 are accessible from this first gate location 142.1 and are etched, for example, by performing a wet etching (FIG. 10). This etching forms empty spaces 143 between the nanowires 124 (three empty spaces 143.1-143.3 in the example of FIG. 10).

A first gate 145 is then produced in the first gate location 142.1 and in the empty spaces 143 between the nanowires 124. A first gate dielectric 144 of this first gate 145 is first conformally deposited against the walls of the first gate location 142.1 and the empty spaces 143 between the nanowires 124 (see FIG. 10). This first gate dielectric 144 is formed of one or more stacked dielectric materials, deposited in particular against the first side face 139.1 formed by the first side faces of the nanowires 124 as well as against the upper and lower walls of the nanowires 124 accessible from the empty spaces 143. The first gate dielectric 144 comprises, for example, a high-permittivity dielectric material (also named a High-K dielectric, and for which the dielectric permittivity is, for example, greater than approximately 3.9), such as for example $HfO_2$ and/or $Al_2O_3$, and has, for example, a thickness between approximately 1 nm and 5 nm. According to an exemplary embodiment, the first gate dielectric 144 comprises a first layer of $SiO_2$ of thickness equal to approximately 0.7 nm and a second layer of $HfO_2$ of thickness equal to approximately 1.7 nm.

The first gate 145 also comprising a first gate conductive material 146, for example formed of one or more electrically conductive materials such as one or more metals, is then deposited in the remaining space of the first gate location 142.1 and the empty spaces 143, covering the first gate dielectric 144. The first gate conductive material 146 comprises, for example, TiN and/or TaN and/or W. This first gate conductive material 146 of the first gate 145 is formed here by a deposition and then a planarisation (for example a CMP) with stop on the insulating dielectric 140 and on the layer 136.

Figure 12:
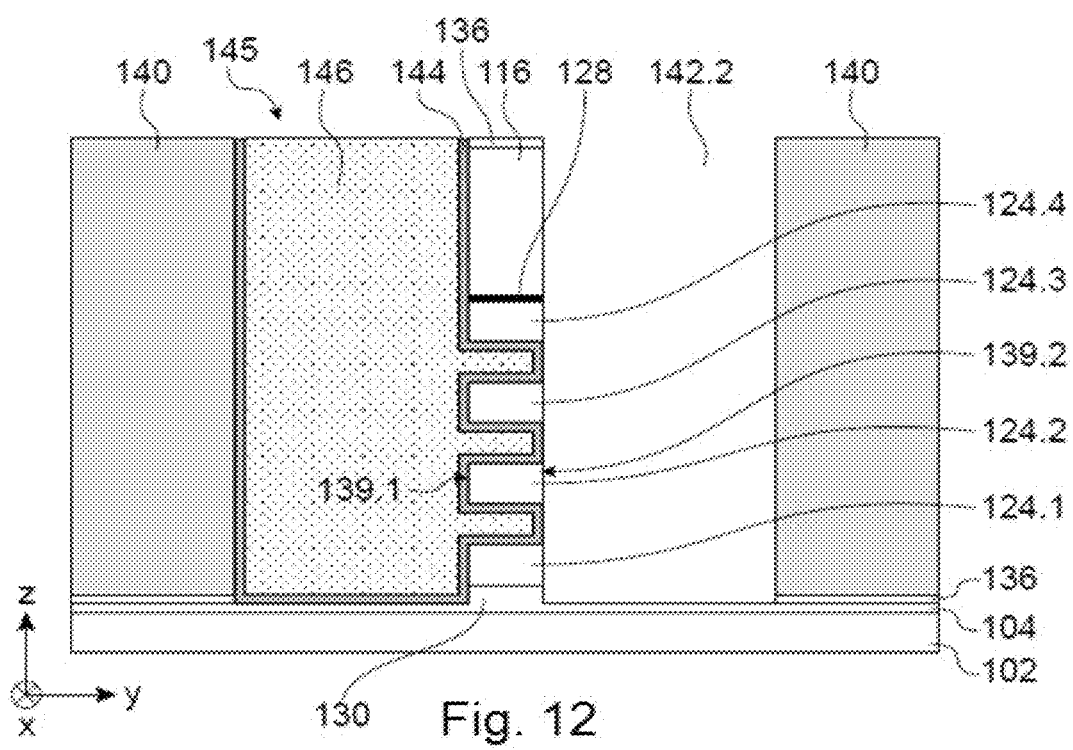

The second dummy gate 138.2 is then etched. As for the etching of the first dummy gate 138.1, the etching of the second dummy gate 138.2 is selective with respect to the materials of the nanowires 124 and of the hard mask 116 and is, for example, similar to that implemented for the etching of the first dummy gate 138.1 (wet TMAH etching). An etching mask is produced above the first gate 145 in order that the first gate 145 is not impacted by this etching. The portions of the layer 136 located against the side flanks of the stack 116+124+128+134 and against the layer 104 are also etched. As illustrated in FIG. 12, at the end of this etching, a second gate location 142.2 is formed by the empty space obtained at the location previously occupied by the second dummy gate 138.2. The second side face 139.2 of the channel of the transistor 100 is accessible from this second gate location 142.2 and forms part of the walls of this second gate location 142.2.

Figure 13:
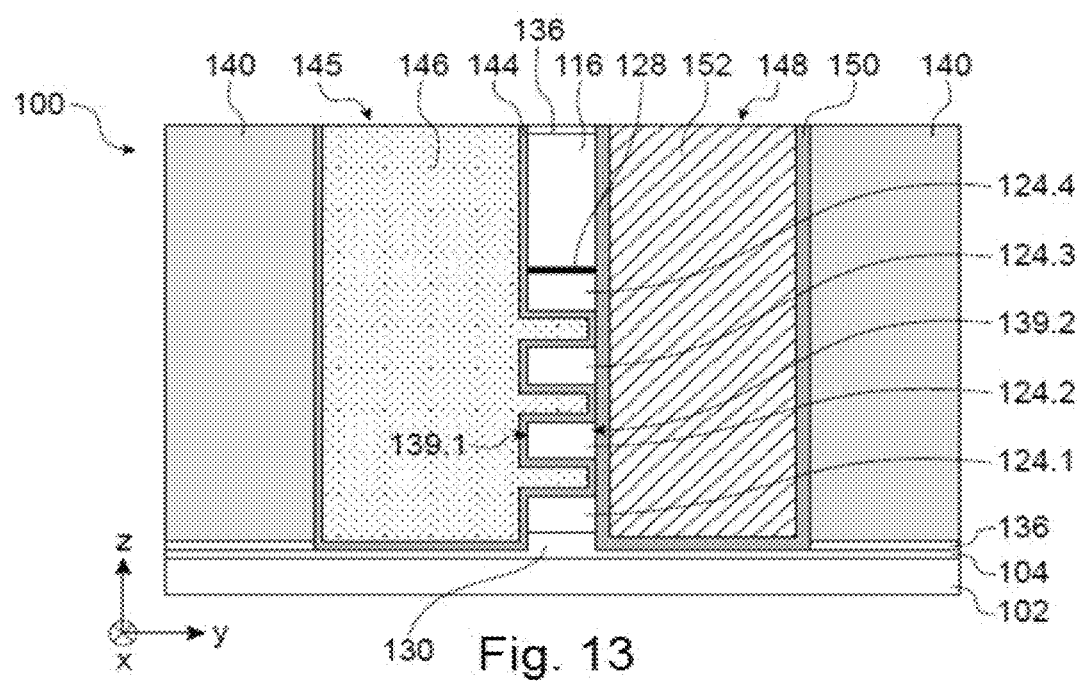

As illustrated in FIG. 13, a second gate 148 is produced in the second gate location 142.2. This second gate 148 is formed of a second gate dielectric 150 and a second gate conductive material 152. This second gate 148 is produced, in particular, against the second side face 139.2 of the channel which corresponds to the second side faces of the nanowires 124.

Unlike the first gate 145, the function of which is similar to that of a front gate of an FET transistor, i.e. serving to trigger the passing or blocking of the current through the channel of the transistor 100, the second gate 148 of the transistor 100 may serve to modulate the electrostatic control of the nanowires 124 and thus to modulate the value of the threshold voltage of the transistor 100 in order to increase the level of current at low threshold voltage (increasing the performance of the transistor 100) or to reduce the leak current at higher threshold voltage of the transistor 100 (lower the consumption of the transistor 100). Thus, the materials and the thicknesses of the second gate dielectric 150 and of the second gate conductive material 152 are adapted depending on the range of values in which the threshold voltage of the transistor 100 is intended to be modulated. For example, the second gate dielectric 150 comprises $HfO_2$, or more generally a dielectric material having dielectric constant between approximately 3 and 20, and its thickness is, for example, between approximately 1 nm and 10 nm, or advantageously between approximately 1 nm and 5 nm. The metal forming the second gate conductive material 152 is, in particular, chosen according to the value of its work function, this metal being able to be similar, or not, to the first gate conductive material 146 of the first gate 145.

The transistor 100 is then completed by producing electrical contacts connected to the first and second gates 145, 148 and which are located, in the first embodiment described here, on the front face of the transistor 100. Thus, the first electrical potential applied on the electrical contact connected to the first gate 145 triggers or blocks, depending on its value, the passage of the current through the channel of the transistor 100 formed by the nanowires 124. The second electrical potential applied on the electrical contact connected to the second gate 148 modulates, depending on its value, the threshold voltage of the transistor 100.

Although this transistor 100 advantageously functions by applying distinct electrical potentials on the first and second gates 145, 148, it is however possible to apply a same electrical potential on the first and second gates 145, 148, or even to electrically connect together the first and second gates 145, 148, for example when the threshold voltage of the transistor 100 is not to be modulated.

In the first embodiment described above, the transistor 100 comprises a single stack of a plurality of nanowires 124.

Figure 14:
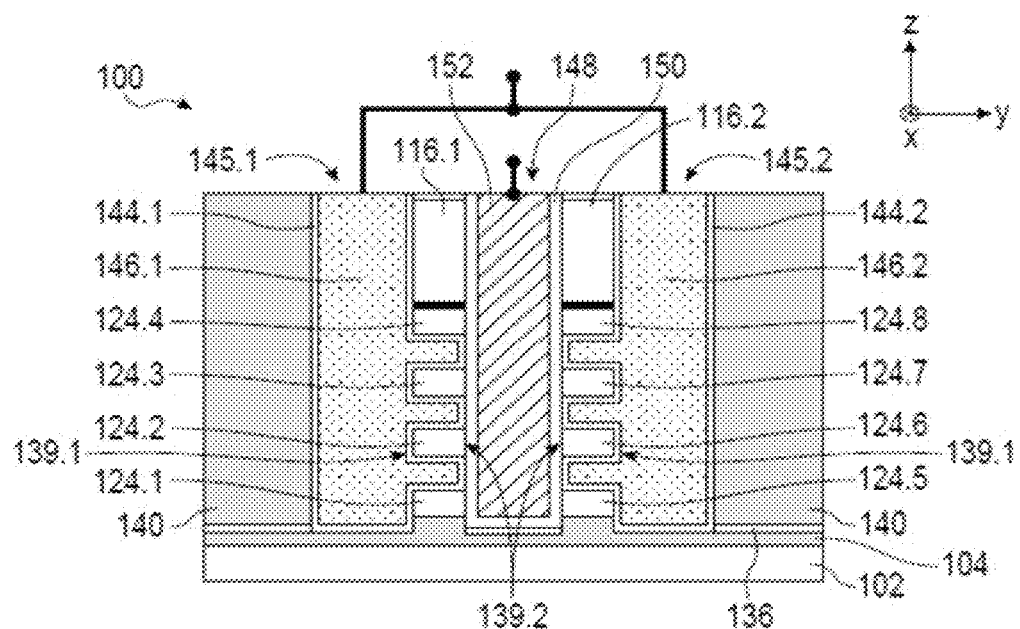
FIGS. 14 and 15 each show an FET transistor obtained by implementing a method for producing an FET transistor with threshold voltage that can be modulated, according to a second and a third embodiment respectively.

According to a second embodiment, the transistor 100 comprises a plurality of stacks of nanowires arranged one beside the other. FIG. 14 illustrates an exemplary embodiment of such a transistor 100 according to the second embodiment. In FIG. 14, the transistor 100 comprises two stacks of nanowires 124.1-124.4 and 124.5-124.8 formed one beside the other on the substrate, the nanowires 124 of each of the first and second stacks being stacked one above the other. Each of these two stacks of nanowires is covered by a hard mask 116.1, 116.2.

In this second embodiment, the nanowires 124 of each of the first and second stacks each comprise first and second side faces forming first and second side faces of the channel of the transistor 100.

Here, the second gate 148 is arranged between the first and second stacks of nanowires 124 and against the second side faces of the nanowires 124 of these two stacks which form the second side faces of the channel of the transistor 100.

Moreover, in this second embodiment, the first gate comprises two distinct parts 145.1, 145.2 each produced on one side of one of the stacks of nanowires 124.1-124.4 and 124.5-124.8 opposite to that where the second gate 148 is formed. Each of these two parts 145.1, 145.2 comprises a first gate dielectric 144.1, 144.2 and a first gate conductive material 146.1, 146.2, for example similar to that described above in connection with the first embodiment. One of these two parts 145.1 of the first gate is arranged against the first side faces of the nanowires of one of the two stacks of nanowires 124 and between the nanowires of this stack. The other of the two parts 145.2 of the first gate is arranged against the first side faces of the nanowires of the other of the two stacks of nanowires 142, between the nanowires of this stack.

The electrical contacts connected to the first and second gates 145, 148 are illustrated schematically in FIG. 14, the two parts 145.1, 145.2 of the first gate being electrically connected together on the front face of the transistor 100. The second gate 148 is also electrically connected to an electrical contact on the front face of the transistor 100.

In a variant, it is possible that the first gate 145 is formed between the two stacks of nanowires 124, and that the second gate 148 comprises two distinct parts, each produced on a side of one of the stacks of nanowires 124 opposite to that where the first gate is formed.

As for the first embodiment, when the threshold voltage of the transistor 100 is not intended to be modulated, the two parts 145.1, 145.2 of the first gate and the second gate 148 can be electrically connected together or a same electrical potential can be applied on the two parts 145.1, 145.2 of the first gate and the second gate 148.

The transistor 100 according to the second embodiment is produced by implementing steps similar to those described above for the production of the transistor 100 according to the first embodiment.

Figure 15:
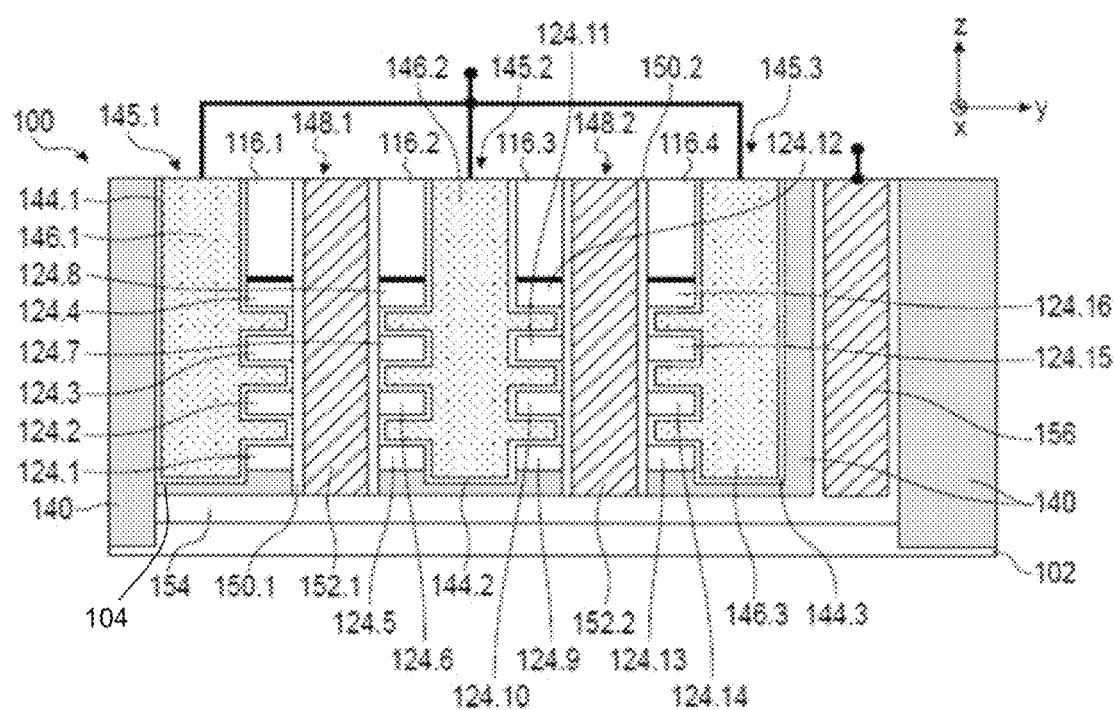

FIG. 15 illustrates the transistor 100 according to a third embodiment.

In this third embodiment, the transistor 100 comprises a plurality of first and second stacks of nanowires 124 arranged one beside the other on the substrate, the nanowires 124 of each of these stacks being stacked one above the other. In the exemplary embodiment described here, the transistor 100 comprises two first stacks of nanowires 124.1-124.4 and 124.9-124.12 and two second stacks of nanowires 124.5-124.8 and 124.13-124.16, and each of these first and second stacks comprises four stacked nanowires.

The first gate comprises a plurality of distinct parts, each arranged against the first side faces of the nanowires of one of the first stacks or against the first side faces of the nanowires of one of the first stacks and one of the second stacks. In the exemplary embodiment illustrated in FIG. 15, the first gate comprises a first part 145.1 formed in particular against the first side faces of the first stack of nanowires 124.1-124.4 and between these nanowires. The first gate also comprises a second part 145.2 formed between the second stack of nanowires 124.5-124.8 and the first stack of nanowires 124.9-124.12 and common to these two stacks. This second part 145.2 of the first gate is arranged, in particular, against the first side faces of the nanowires 124.5-124.8 and 124.9-124.12 and between these nanowires. Finally, the first gate comprises a third part formed on one side of the second stack of nanowires 124.13-124.16, against the first side face of these nanowires 124.13-124.16 and between these nanowires. In addition, each of the parts 145.1-145.3 of the first gate comprises a first gate dielectric 144.1-144.3 and a first gate conductive material 146.1-146.3, for example similar to those described above in connection with the first embodiment.

The second gate also comprises a plurality of distinct parts, each arranged between one of the first stacks of nanowires and one of the second stacks of nanowires. In the example illustrated in FIG. 15, the second gate comprises a first part 148.1 formed between the first and second stacks of nanowires 124.1-124.4 and 124.5-124.8 and common to these two stacks, and against the second side faces of these nanowires. The second gate also comprises a second part 148.2 formed between the first and second stacks of nanowires 124.9-124.12 and 124.13-124.16 and common to these two stacks, and against the second side faces of these nanowires. In addition, each of the parts 148.1, 148.2 of the second gate comprises a second gate dielectric 150.1, 150.2 and a second gate conductive material 152.1, 152.2, for example similar to those described above in connection with the first embodiment.

The three parts 145.1-145.3 of the first gate are electrically connected together at a same electrical contact formed on the front face of the transistor 100. The two parts 148.1, 148.2 of the second gate are electrically connected together via an electrically conductive layer 154 formed under the buried dielectric layer 104, for example by a strong doping of an upper part of the layer 102, and by means of an electrical contact 156 passing through the insulating dielectric 140 and making the second gate electrically accessible from the front face of the transistor 100.

Such an electrically conductive layer 154 formed under the buried dielectric layer 104 may be present whatever the embodiment of the transistor 100, and be electrically connected to one or the other of the two gates of the transistor 100.

The transistor 100 according to the third embodiment is produced by implementing steps similar to those described above for the production of the transistor 100 according to the first embodiment.

In the second and third embodiments described above, the first gate 145 is produced in the form of an interdigitated gate.

In the various embodiments described above, the transistor 100 is produced from a semiconductor-on-insulator substrate. As a variant, it is possible that the transistor 100 is produced from a bulk substrate, comprising a thick layer of semiconductor, for example silicon. In this case, prior to implementing the steps forming the stack or stacks of nanowires 124, isolating regions, for example shallow trench isolation (STI) regions are produced in the thick layer of semiconductor, in order to electrically isolate the stack or stacks of nanowires 124 produced on this thick layer of semiconductor.

The features obtained with a particular exemplary embodiment of the transistor 100 according to the second embodiment are described below. In this particular exemplary embodiment, each of the nanowires 124 has a height H (dimension along the axis Z of FIG. 14, and which corresponds to the thickness of the layers 106 and 110 from which the nanowires 124 are produced) equal to 7 nm and a width W (dimension along the axis Y of FIG. 14, and which corresponds to the dimension parallel to the main plane of the substrate and substantially perpendicular to the direction of flow of the current in these nanowires 124) equal to 10 nm. The first gate dielectric 144 of the first gate 145 is formed of a first layer of $SiO_2$ of thickness equal to 0.7 nm and a second layer of $HfO_2$ of thickness equal to 1.7 nm. The second gate dielectric 150 of the second gate 148 is formed of a layer of $SiO_2$ of thickness equal to 5 nm. Here, the gate conductors 146, 152 of the first and second gates are similar in nature to each other and correspond, for example, to a midgap type material, such as TiN.

Figure 16:
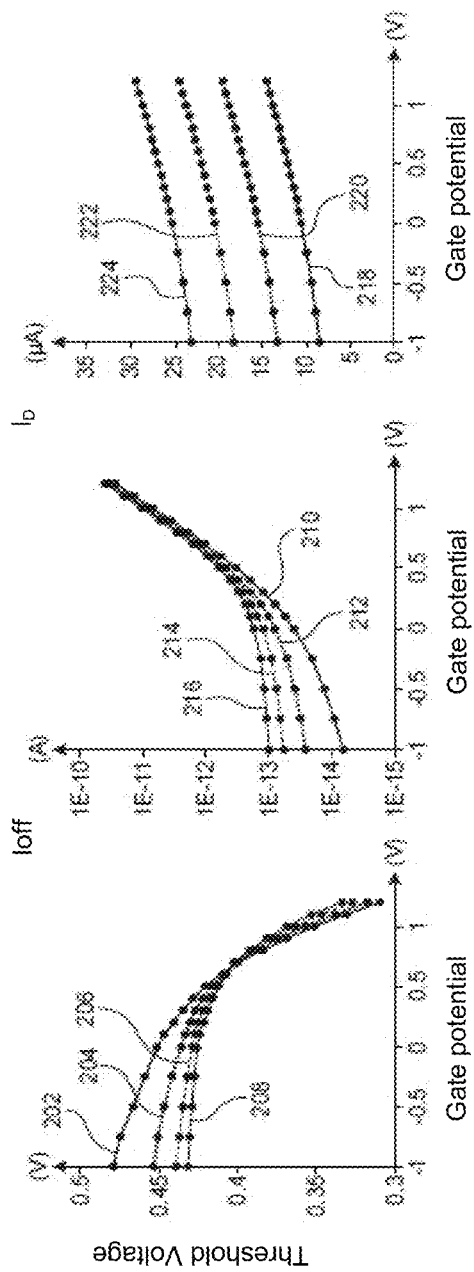
FIGS. 16 to 21 show the properties obtained with a particular exemplary embodiment of the FET transistor formed by the implementation of a method for producing an FET transistor with threshold voltage that can be modulated, according to the second embodiment.

The curves 202, 204, 206 and 208, visible in FIG. 16, show the value of the threshold voltage (value on the y-axis) of such a transistor 100 as a function of the value of the electric potential applied on the second gate 148 (value on the x-axis), for various values of width W of the nanowires 124: W=10 nm for curve 202; W=15 nm for curve 204; W=20 nm for curve 206; W=25 nm for curve 208.

The curves 210, 212, 214 and 216, visible in FIG. 16, show the value of the current Ioff of the transistor 100 in the OFF state (value on the y-axis, with a logarithmic scale) of such a transistor 100 as a function of the value of the electric potential applied on the second gate 148 (value on the x-axis), for various values of width W of the nanowires 124: W=10 nm for curve 210; W=15 nm for curve 212; W=20 nm for curve 214; W=25 nm for curve 216.

The curves 218, 220, 222 and 224, visible in FIG. 16, show the value of the drain current $I_D$ of the transistor 100 in the ON state (value on the y-axis) of such a transistor 100, as a function of the value of the electric potential applied on the second gate 148 (value on the x-axis), for various values of width W of the nanowires 124: W=10 nm for curve 218; W=15 nm for curve 220; W=20 nm for curve 222; W=25 nm for curve 224.

The various curves illustrated in FIG. 16 show that the modulation of the threshold voltage of the transistor 100 by means of the second gate 148 is larger, the smaller the width W of the nanowires 124. These curves also show that the modification of the threshold voltage produced by means of the second gate 148 makes it possible to obtain a large variation in the current Ioff and the current $I_D$ of the transistor 100.

Figure 17:
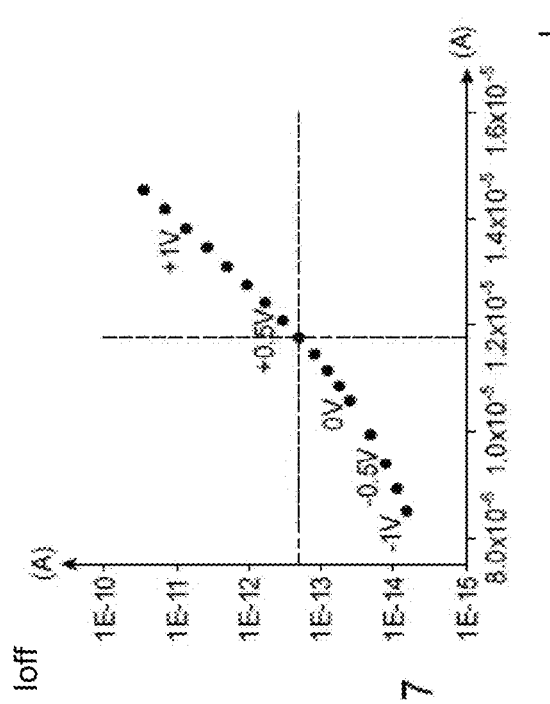

The measurement points illustrated in FIG. 17 show the values of the current Ioff (with a logarithmic scale on the y-axis) as a function of the current $I_D$ obtained in this same transistor 100 for various values of the electrical potential applied on the second gate 148, and for a width W of the nanowires 124 equal to 10 nm. These measurements show that it is possible, by choosing the suitable value of the electrical potential applied on the second gate 148, to lower the value of the current Ioff of the transistor 100 in the OFF state by a factor greater than 10 (by choosing, for example, an electrical potential applied on the second gate 148 with a value equal to approximately −1 V), or to increase the value of the current $I_D$ of the transistor 100 in the ON state by more than 40% (by choosing, for example, an electrical potential applied on the second gate 148 with value equal to approximately +1 V).

Figure 18:
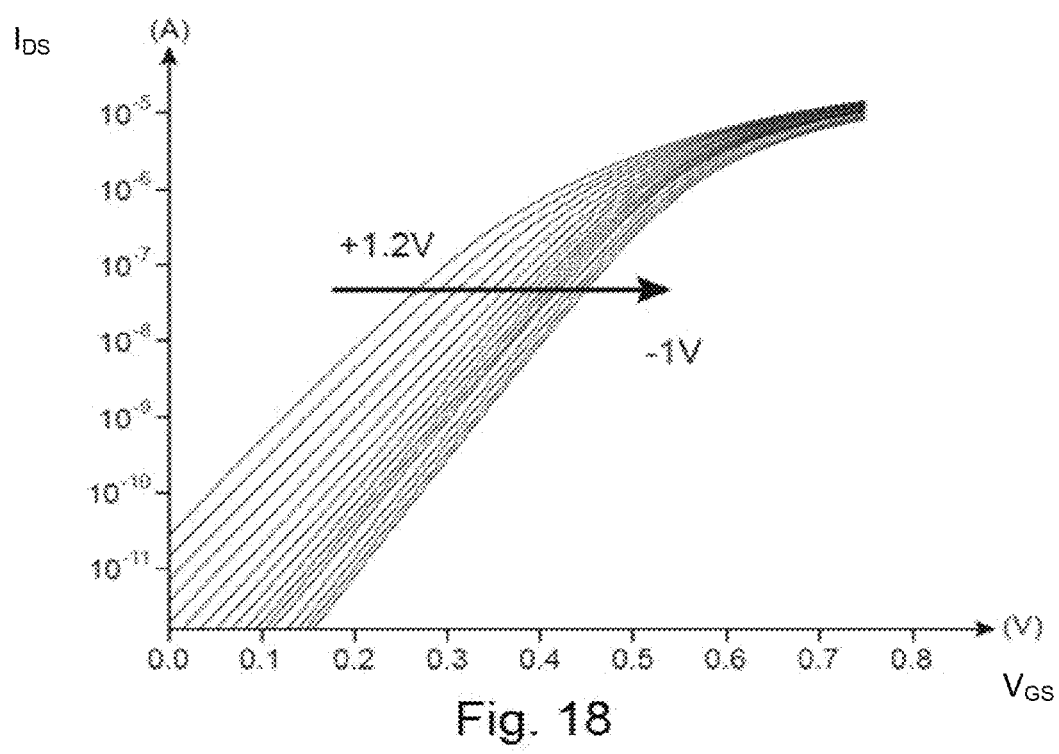
Figure 19:
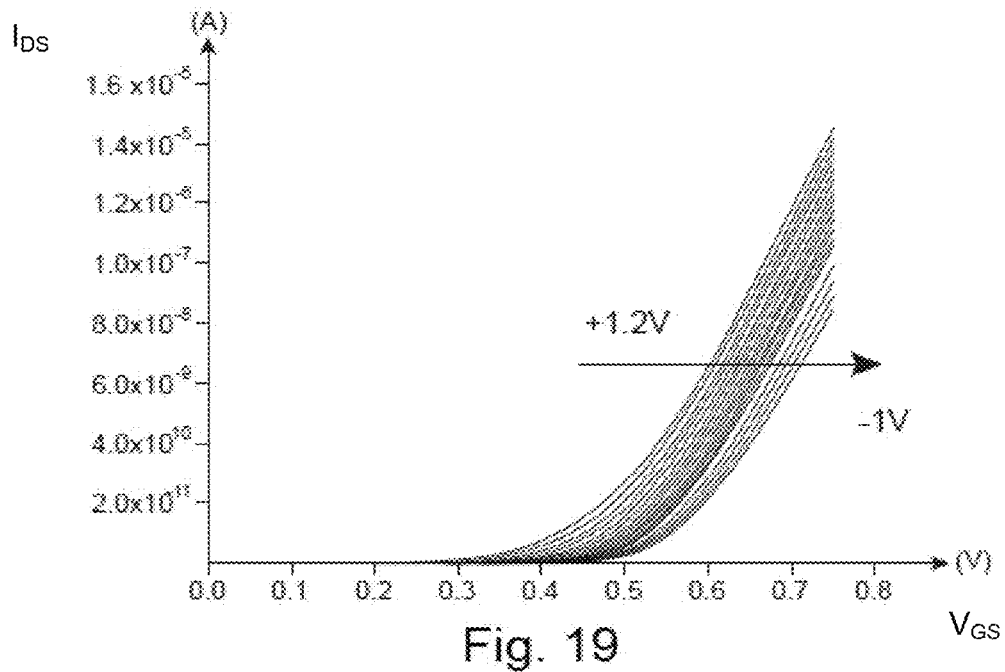

FIG. 18 illustrates, with a logarithmic scale, the characteristic $I_{DS}(V_{GS})$ of such a transistor 100 for various values of the voltage applied on the second gate (from 1.2 V to −1 V). FIG. 19 illustrates this same characteristic with a linear scale.

Figure 20:
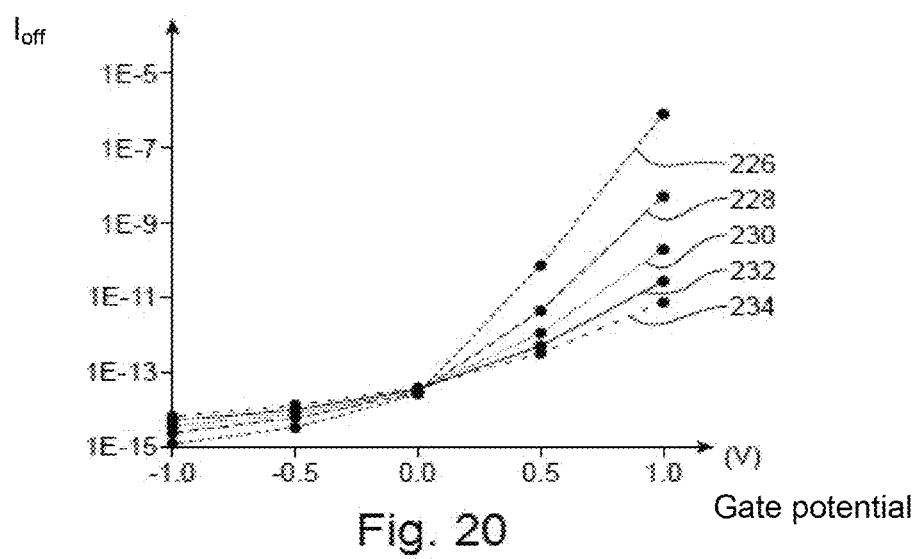

The curves 226, 228, 230, 232 and 234 visible in FIG. 20 show the value of the current Ioff (value on the y-axis, with a logarithmic scale) of such a transistor 100 as a function of the value of the electric potential applied on the second gate 148 (value on the x-axis), for a width W of the nanowires 124 equal to 10 nm and for various values of the thickness of the second gate dielectric 150: 1 nm for curve 226; 2 nm for curve 228; 3 nm for curve 230; 4 nm for curve 232; 5 nm for curve 234.

Figure 21:
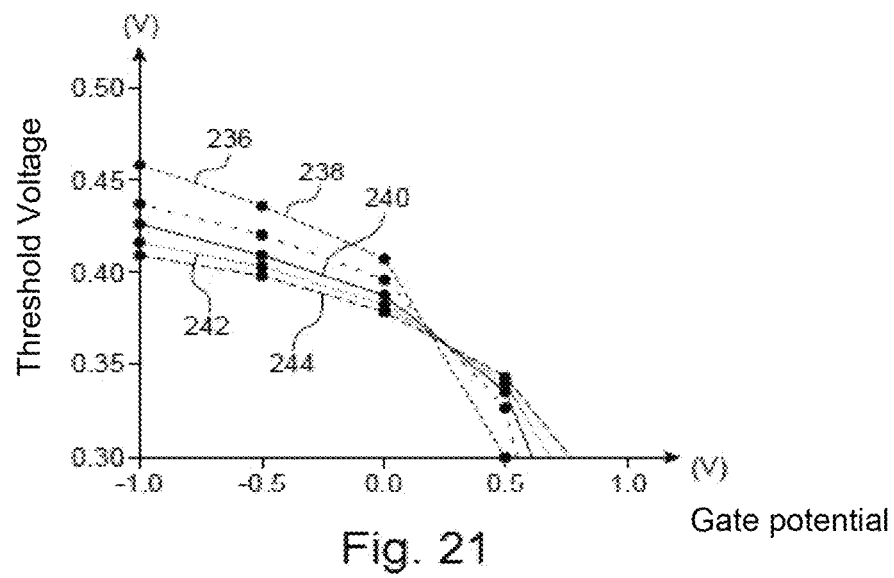

The curves 236, 238, 240, 242 and 244, visible in FIG. 21, illustrate the value of the threshold voltage (value on the y-axis) of such a transistor 100 as a function of the value of the electric potential applied on the second gate 148 (value on the x-axis), for a width W of the nanowires 124 equal to 10 nm and for various values of the thickness of the second gate dielectric 150: 1 nm for curve 236; 2 nm for curve 238; 3 nm for curve 240; 4 nm for curve 242; 5 nm for curve 244. These curves show that the threshold voltage obtained is larger, the greater the reduction in the thickness of the second gate dielectric 150.

A method for producing an FET transistor 100 with threshold voltage that can be modulated, according to a fourth embodiment, is described below in connection with FIGS. 22 to 23.

The steps described above in connection with FIGS. 1 to 5 are first implemented.

Figure 22:
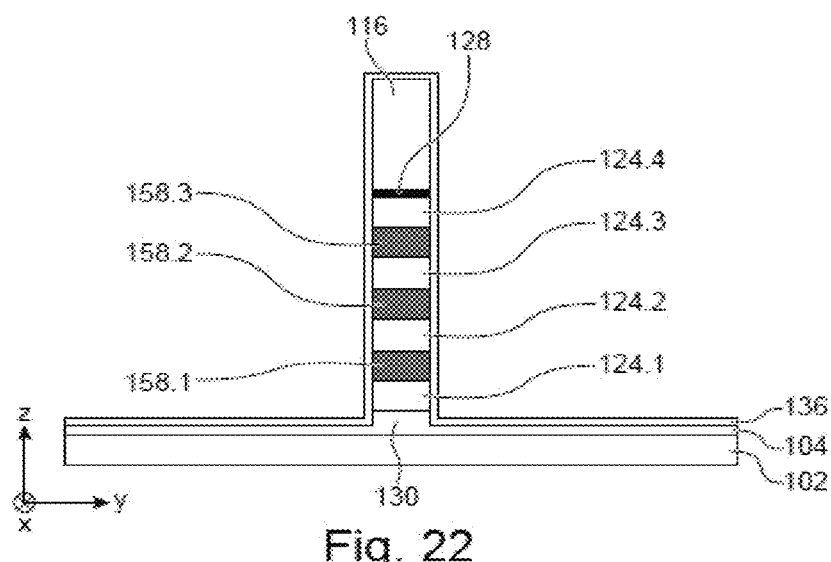
FIGS. 22 and 23 show some of the steps of a method for producing an FET transistor with threshold voltage that can be modulated, according to a fourth embodiment.
Figure 23:
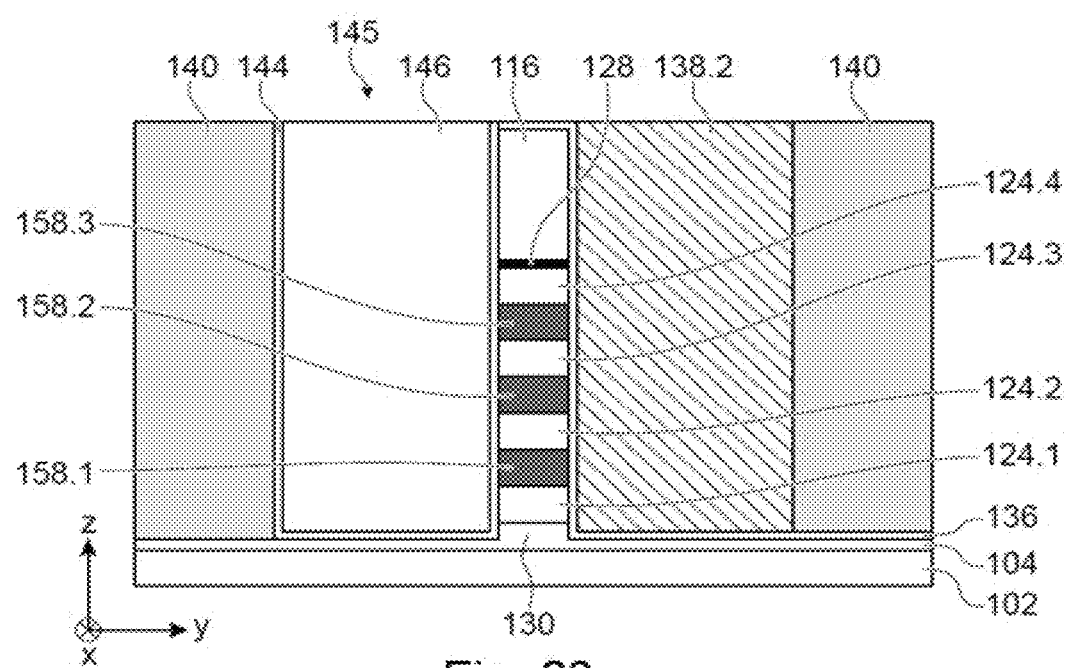

A dielectric material with high dielectric permittivity, in other words having a relative permittivity $\varepsilon_R$ greater than that of $SiO_2$ which is equal to 3.9, is then deposited in a conformal manner over the entire structure produced, and is then etched (for example by wet etching) in order to preserve only the portions 158 (three portions 158.1-158.3 in this example) of the dielectric material which fill the empty spaces 132 between the nanowires 124 (see FIG. 22). The high-permittivity dielectric material of portions 158 is, for example, $TiO_2$ ($\varepsilon_R$=80) and/or $HfO_2$ ($\varepsilon_R$=80) and/or $ZrO_2$ ($\varepsilon_R$=25) and/or $Ta_2O_5$ ($\varepsilon_R$=22) and/or $Al_2O_3$ ($\varepsilon_R$=9) and/or $Si_3N_4$ ($\varepsilon_R$=7) and/or HfSiON ($\varepsilon_R$=20) and/or $SrTiO_3$ ($\varepsilon_R$=2000) and/or $Y_2O_3$ ($\varepsilon_R$=15). Advantageously the dielectric material forming the portions 158 has a relative permittivity between approximately 20 and 80. This high relative permittivity of the dielectric material of the portions 158 makes it possible to promote the penetration of the field lines into the semiconductor of the nanowires 124.

The second etch stop layer 136 is then deposited on the entire structure produced, thus covering the layer 104, the side flanks of the nanowires 124, the dielectric portions 158, the portion 128 and the hard mask 116, as well as the upper face of the hard mask 116.

The steps described above in connection with FIGS. 7 to 9 are then implemented in order to form the dummy gates 138 and the insulating dielectric 140, and etching the first dummy gate 138.1.

The first gate 145 is then produced as described above in connection with the first embodiment. However, unlike the first embodiment in which the dielectric portions 134 are etched in order that the parts of the first gate 145 extend between the nanowires, the dielectric portions 158 present between the nanowires 124 are preserved during the production of the first gate 145.

The transistor 100 is then completed by carrying out the steps described above in connection with FIGS. 12 to 13 in order to form the second gate 148, while preserving the dielectric portions 158 between the nanowires 124.

The variants described above in connection with the first, second and third embodiments can be applied to this fourth embodiment.

The previously described method for producing the transistor 100 is advantageously implemented in order to simultaneously form a plurality of transistors 100 on the same substrate. Whatever the embodiment, the threshold voltage of each transistor 100 can be dynamically modulated by modifying the value of the electrical potential applied on one of the two gates of the transistor (the second gate 148 in the examples described above).

The production method implemented in order to produce the transistors 100 also makes it possible to produce transistors with identical structure, with similar gate materials and thicknesses of gate materials between one transistor and the other, but which are intended to function with different values of threshold voltage from each other. In this case, electrical potentials of different values are applied on the second gates of these transistors in order that these transistors operate with a threshold voltage of different values from each other.

The invention claimed is:

1. A method for producing an FET transistor, comprising at least the implementation of the following successive steps:
    producing an FET transistor channel comprising at least one semiconductor nanowire arranged on a substrate and comprising first and second opposite side faces substantially perpendicular to a face of the substrate on which the channel is arranged and substantially parallel to a direction of flow of a conduction current intended to pass through the channel when the FET transistor is in an ON state;
    producing at least two dummy gates, each arranged against one of the first and second side faces of the channel;
    etching a first of the two dummy gates, forming at least one first gate location against the first side face of the channel;
    producing at least one first gate in the first gate location and at least against the first side face of the channel;
    etching a second of the two dummy gates, forming at least one second gate location against the second side face of the channel; and
    producing at least one second gate in the second gate location and at least against the second side face of the channel.

2. The method according to claim 1, wherein:
    the channel comprises a plurality of nanowires, stacked vertically; and
    each nanowire comprises first and second side faces forming the first and second side faces of the channel.

3. The method according to claim 2, wherein the production of the channel comprises the implementation of the following steps:
    producing, on the substrate, an alternating stack of first semiconductor layers and at least one second layer of material configured to be selectively etched with respect to a semiconductor of the first semiconductor layers;
    producing an etching mask on the stack, a pattern of which, in a plane parallel to the substrate, corresponds to that of the channel; and
    etching the stack according to the etching mask pattern, such that remaining portions of the first semiconductor layers form nanowires.

4. The method according to claim 3, wherein the production of the two dummy gates comprises the implementation of the following steps:
- depositing at least one sacrificial material covering the substrate and the channel;
- planarisation of the sacrificial material with stop on the etching mask; and
- etching of the sacrificial material such that at least two remaining portions of the sacrificial material form the two dummy gates.

5. The method according to claim 3, further comprising, after etching of the stack, implementing an etching step of at least one remaining portion of the second layer arranged between the nanowires.

6. The method according to claim 5, further comprising, between the etching of said at least one remaining portion of the second layer arranged between the nanowires and the production of the two dummy gates, the implementation of a step of producing at least one portion of dielectric material between the nanowires.

7. The method according to claim 6, wherein the portion of dielectric material comprises at least one dielectric material having a relative permittivity greater than 3.9, and wherein the portion of dielectric material is preserved during the implementation of the steps of producing the first and second gates.

8. The method according to claim 6, wherein the production of the first gate comprises the implementation of the following steps:
- depositing a first high-permittivity gate dielectric in the first gate location and at least against the first side face of the channel; and
- depositing a first gate conductive material in the first gate location and against the first gate dielectric;

and wherein the production of the second gate comprises the implementation of the following steps:
- depositing a second gate dielectric in the second gate location and at least against the second side face of the channel; and
- depositing a second gate conductive material in the second gate location and against the second gate dielectric;

and further comprising, between the production of said at least one portion of dielectric material between the nanowires and the depositing of the first gate dielectric, the implementation of an etching step of said at least one portion of dielectric material, and wherein the first gate dielectric is also deposited between the nanowires, against walls of the nanowires which are substantially perpendicular to the side faces of the channel.

9. The method according to claim 1, wherein the production of the first gate comprises the implementation of the following steps:
- depositing a first high-permittivity gate dielectric in the first gate location and at least against the first side face of the channel; and
- depositing a first gate conductive material in the first gate location and against the first gate dielectric;

and wherein the production of the second gate comprises the implementation of the following steps:
- depositing a second gate dielectric in the second gate location and at least against the second side face of the channel; and
- depositing a second gate conductive material in the second gate location and against the second gate dielectric.

10. The method according to claim 1, wherein:
- the channel comprises a first and a second stack of nanowires, the first stack being arranged beside the second stack on the substrate, the nanowires of each of the first and second stacks being stacked vertically;
- the nanowires of each of the first and second stacks each comprise first and second side faces forming the first and second side faces of the channel;
- the second gate is arranged between the first and second stacks of nanowires and against the second side faces of the nanowires of the first and second stacks; and
- the first gate comprises at least two distinct parts, a first part of the two parts of the first gate being arranged against the first side faces of the nanowires of the first stack, and a second part of the two parts of the first gate being arranged against the first side faces of the nanowires of the second stack.

11. The method according to claim 1, wherein:
- the channel comprises a plurality of first and second stacks of nanowires, the first and second stacks arranged in an alternating order on the substrate, the nanowires of each of the first and second stacks being stacked vertically;
- the nanowires of each of the first and second stacks each comprise first and second side faces;
- the second gate comprises a plurality of distinct parts, each arranged between one of the first stacks of nanowires and one of the second stacks of nanowires and against the second side faces of the nanowires of said one of the first stacks and one of the second stacks; and
- the first gate comprises a plurality of distinct parts, each arranged against the first side faces of the nanowires of one of the first and second stacks or against the first side faces of the nanowires of one of the first stacks and one of the second stacks.

12. The method according to claim 1, wherein the substrate comprises a dielectric layer and an electrically conductive layer, such that the dielectric layer is arranged between the channel and the electrically conductive layer, and wherein one of the first and second gates is electrically connected to the electrically conductive layer.

13. The method according to claim 1, wherein the substrate is of the semiconductor-on-insulator type.

14. An FET transistor comprising at least:
- a substrate;
- a channel formed of a stack of at least two nanowires arranged on the substrate, each nanowire comprising first and second opposite side faces substantially perpendicular to a face of the substrate on which the channel is arranged and substantially parallel to a direction of flow of a conduction current intended to pass through the channel when the FET transistor is in an ON state, and each nanowire comprising opposite lower and upper faces substantially parallel to said face of the substrate;
- a first gate arranged against the first side faces of the nanowires and comprising at least one extension region extending between the nanowires in such a way as to form an interdigitated gate and covering the upper face of a first of the nanowires and a lower face of a second of the nanowires; and
- a second gate, and wherein the second gate covers, among all the faces of the nanowires, only the second side face of at least one of the nanowires.

15. The FET transistor according to claim 14, wherein each of the first and second gates comprises at least one gate dielectric distinct from that of another gate, and at least one gate conductive material distinct from that of the other gate, and wherein, in the extension region of the first gate, the gate conductive materials of the first and second gates are insulated from each other at least by the gate dielectrics of the first and second gates.

\* \* \* \* \*